(12) United States Patent
Yang et al.

(10) Patent No.: US 8,287,753 B2
(45) Date of Patent: Oct. 16, 2012

(54) GEL ELECTROLYTE COMPOSITION, METHOD OF FABRICATING THEREOF AND DYE-SENSITIZED SOLAR CELL USING THE SAME

(75) Inventors: Cheng-Hsien Yang, Tainan County (TW); Hao-Hsun Yang, Tainan (TW); Mao-Lin Hsueh, Pingtung County (TW); Li-Key Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 368 days.

(21) Appl. No.: 12/718,222

(22) Filed: Mar. 5, 2010

(65) Prior Publication Data
US 2011/0114167 A1    May 19, 2011

(30) Foreign Application Priority Data
Nov. 13, 2009    (TW) ................................ 98138640 A

(51) Int. Cl.
*H01G 9/02*    (2006.01)
*H01L 31/00*    (2006.01)

(52) U.S. Cl. ...................................... 252/62.2; 136/256
(58) Field of Classification Search .................. 252/62.2; 136/256
See application file for complete search history.

(56) References Cited

U.S. PATENT DOCUMENTS

| | | | |
|---|---|---|---|
| 6,281,429 B1 * | 8/2001 | Takada et al. | 136/256 |
| 6,376,765 B1 * | 4/2002 | Wariishi et al. | 136/263 |
| 6,911,595 B2 * | 6/2005 | Yoshikawa et al. | 136/263 |

* cited by examiner

*Primary Examiner* — Jennifer Michener
*Assistant Examiner* — Eli Mekhlin
(74) *Attorney, Agent, or Firm* — Birch, Stewart, Kolasch & Birch, LLP

(57) ABSTRACT

A gel electrolyte composition is provided. The composition of the gel electrolyte includes an unsubstituted or substituted pyridine, a metal salt, a halogen molecule, an unsubstituted or substituted nicotinic acid and a solvent. The composition may be free from or substantially free from one or more of a polymer and a low molecular gelling agent. Also provided is a dye-sensitized solar cell containing the composition as well as a method for preparing the composition.

19 Claims, 1 Drawing Sheet

GEL ELECTROLYTE COMPOSITION, METHOD OF FABRICATING THEREOF AND DYE-SENSITIZED SOLAR CELL USING THE SAME

This application claims the benefit of the Taiwan Patent Application No. 98138640, filed on Nov. 13, 2009, which is hereby incorporated by reference.

BACKGROUND OF THE INVENTION

1. Field of Invention

The present invention relates to an electrolyte composition, a method of fabricating thereof and a dye-sensitized solar cell using the same. More particularly, the present invention relates to a gel electrolyte composition, a method of fabricating the composition and a dye-sensitized solar cell using the composition. The gel electrolyte composition may optionally be free from or substantially free from one or more of a polymer or a low molecular gelling agent.

2. Description of Related Art

Solar energy is a form of renewable energy available for human consumption in a sustainable manner. It is also a very clean energy source, free from any form of environmental pollution. The effective application of solar energy in a solar cell has been actively pursued by scientists in recent years.

The previous first and second generations of solar cells respectively employ silicon, gallium arsenide as raw materials. The fabrication of silicon is a high energy consumption process, and silicon fabricated at different temperatures affect the conversion efficiency. Hence, solar cells using silicon are deemed non-economical. In addition, arsenic is a type of heavy metal that is highly toxic to the environment.

The third generation solar cells (dye-sensitized solar cells), which are capable of maintaining energy performance and being environmentally friendly, are now being developed. They are safe to use and pollution-free. Further, the temperature range that can be tolerated by dye-sensitized solar cells is larger. Dye-sensitized solar cells are also less sensitive to the incident angle of sunlight and have higher conversion efficiency. Additionally, dye-sensitized solar cells use organic materials that can be rapidly and continuously produced, and the development of these types of material is less confined. Moreover, the cost of a dye-sensitized solar cell using organic materials is about ⅕ to 1/10 of a traditional silicon solar cell. These types of cells are expected to be broadly applied in the fields of 3C and consumer products in the future. Hence, dye-sensitized solar cells are being viewed as the preferred choice of third-generation solar cells.

In 1991, Gratzel applied a nano-titanium dioxide (Nano-TiO$_2$) porous film for fabricating a counter electrode, wherein a ruthenium complex was used as a dye, and iodide ions in the reduction state/iodide ions in the oxidation state (I$^-$/I$_3^-$) served as electrolytes. The overall efficiency of a Gratzel cell is up to 7.1%. However, for a dye-sensitized solar cell product, its stability and lifetime are important factors for the product to enter the market. Basically, a dye-sensitized solar cell belongs to the category of electrochemical cells and the presence of an electrolyte is preferred.

A liquid-type electrolyte has a fast diffusion rate, an excellent penetration characteristic, and a high photoelectric conversion efficiency. Further, the components in a liquid-type electrolyte are easily designed or modified. Moreover, the penetration characteristic of a liquid-type electrolyte through a titanium dioxide nano-porous structure is highly desirable. Hence, research on a liquid-type electrolyte is always being pursued. However, when considering the longevity and the commercialization of a cell, since the electrolyte contains a volatile organic solvent, a change in the electrolyte formulation in the cell may potentially result. Ultimately, the dye-sensitized solar cell degrades, reducing the lifetime of the cell. Additionally, the packaging process of a dye-sensitized solar cell is difficult and the stability of the cell is low. If a product package is damaged, the liquid-type electrolyte not only causes cell failure, but the leakage of the liquid also pollutes the environment.

SUMMARY OF THE INVENTION

The present invention provides an electrolyte composition, which may optionally be a gel electrolyte composition that is free from or substantially free from one or more of a polymer and a low molecular gelling agent, wherein the volatile amount of the electrolyte may be reduced.

The present invention provides a dye-sensitized solar cell, wherein the electrolyte composition may be free from or substantially free from one or more of a polymer and a low molecular gelling agent, and in which the problems of evaporation and loss may be mitigated, the lifetime of the cell may be prolonged, the difficulties in the packaging process may be reduced and the stability of the cell may be enhanced.

The present invention provides a fabrication method of a gel electrolyte composition, wherein the fabrication method is simple and economical.

To improve the problems of evaporation and loss of electrolyte, an electrolyte composition with a particular type of salt mixed therein is provided to achieve gelling of the electrolyte composition. Hence, the lifetime of the dye-sensitized solar cell may be extended and malfunction of the packaging may be reduced to further improve the industrial applicability of the cell.

The present invention provides a gel electrolyte composition, including a substituted or unsubstituted pyridine, a metal salt (MY), a halogen molecule, a substituted or unsubstituted nicotinic acid and a solvent. The gel electrolyte composition may be free from or substantially free from one or more of a polymer and a low molecular gelling agent. Further, the gel electrolyte composition may be a composition prepared by mixing a substituted or unsubstituted pyridine, a metal salt (MY), a halogen molecule, a substituted or unsubstituted nicotinic acid and a solvent The substituted or unsubstituted pyridine may be represented by the following formula (1)

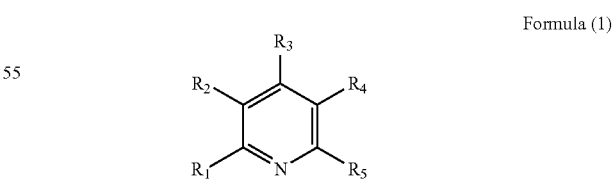

Formula (1)

wherein $R_1$ to $R_5$ are the same or different substituents that independently represent hydrogen, alkyl, hydroxymethyl, vinyl or hydroxyl. The "M" in the metal salt (MY) is an alkali group (IA) metal cation, and "Y" is a halogen anion.

The substituted and unsubstituted nicotinic acid may be represented by the following formula (2):

Formula (2)

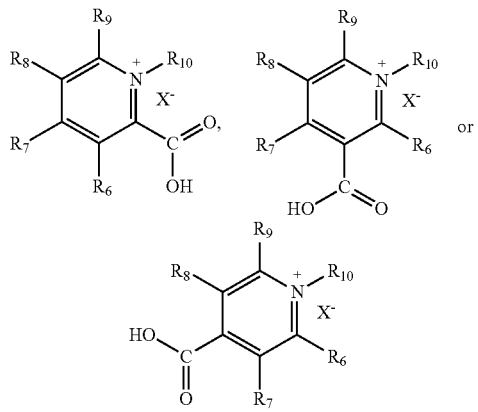

wherein $R_6$ to $R_9$ are the same or different and independently represent hydrogen, alkyl, hydroxyl, amino, trifluoromethyl or halogen, etc., and $R_{10}$ is a $C_nH_{2n+1}$ alkyl, wherein n is 1 to 12. X is an iodide ion, a bromide ion, $ClO_4^-$, $CF_3SO_3^-$, $SCN^-$, $PF_6^-$ or $BF_4^-$.

The present invention provides a dye-sensitized solar cell that includes a working electrode, a counter electrode and a gel electrolyte composition. The counter electrode and the working electrode are disposed correspondingly. The gel electrolyte composition is disposed between the working electrode and the counter electrode. The gel electrolyte composition includes a substituted or unsubstituted pyridine, a metal salt (MY), a halogen molecule, a substituted or unsubstituted nicotinic acid and a solvent. The gel electrolyte composition may be free from or substantially free from one or more of a polymer and a low molecular gelling agent. The substituted or unsubstituted pyridine may be represented by the following formula (1):

Formula (1)

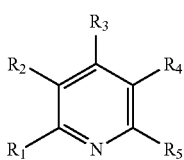

wherein $R_1$ to $R_5$ are the same or different substituents that independently represent hydrogen, alkyl, hydroxymethyl, vinyl or hydroxyl. The "M" in the metal salt (MY) is an alkali group (IA) metal cation, and "Y" is a halogen anion.

The substituted and unsubstituted nicotinic acid may be represented by one of the following formula (2):

Formula (2)

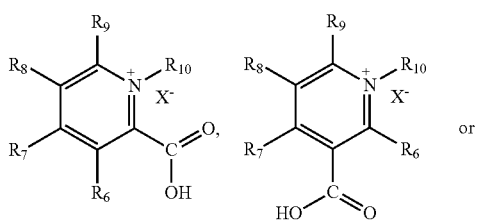

wherein $R_6$ to $R_9$ may be the same or different and independently represent hydrogen, alkyl, hydroxyl, amino, trifluoromethyl or halogen, etc., and $R_{10}$ is a $C_nH_{2n+1}$ alkyl, wherein n is 1 to 12. X is an iodide ion, a bromide ion, $ClO_4^-$, $CF_3SO_3^-$, $SCN^-$, $PF_6^-$ or $BF_4^-$.

The present invention provides a method for preparing a gel electrolyte composition and the method includes dissolving a substituted or unsubstituted nicotinic acid and a halogen molecule in a solvent to form a solution, and adding a metal salt (MY) and a substituted or unsubstituted pyridine into the solution. After mixing, the resulting solution becomes a gel to form a gel electrolyte composition. The gel electrolyte composition may be free from or substantially free from one or more of a polymer and a low molecular gelling agent.

The substituted or unsubstituted pyridine may be represented by the following formula (1):

Formula (1)

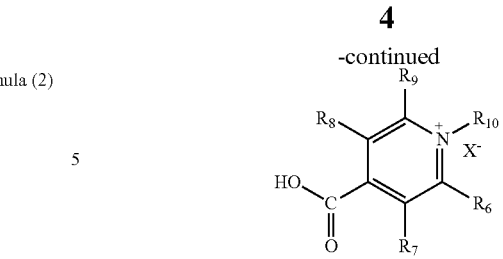

wherein $R_1$ to $R_5$ are the same or different substituents that independently represent hydrogen, alkyl, hydroxymethyl, vinyl or hydroxyl. The "M" in the metal salt (MY) is an alkali group (IA) metal cation, and "Y" is a halogen anion.

The substituted and unsubstituted nicotinic acid may be represented by one of the following formula (2):

Formula (2)

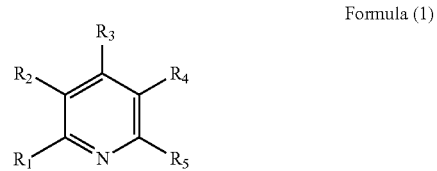

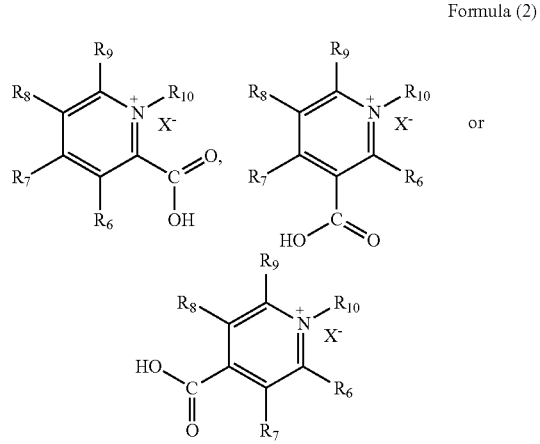

wherein $R_6$ to $R_9$ may be the same or different and independently represent hydrogen, alkyl, hydroxyl, amino, trifluoromethyl or halogen, etc., and $R_{10}$ is a $C_nH_{2n+1}$ alkyl, wherein n is 1 to 12. X is an iodide ion, a bromide ion, $ClO_4^-$, $CF_3SO_3^-$, $SCN^-$, $PF_6^-$ or $BF_4^-$.

The electrolyte composition of an exemplary embodiment of the invention is a gel electrolyte that is free from or is substantially free from one or more of a polymer and a low molecular gelling agent. Preferably, the electrolyte composition is free from any polymer and low molecular gelling agent. Further, the problems of evaporation and loss of the electrolyte may be prevented, the lifetime of the cell may be prolonged, difficulties in the packaging process may be reduced and the stability of the cell may be enhanced. Examples of polymer include, but are not limited to, polyacrylonitrile, poly(methyl methacrylate), poly(vinylpyridine), poly(ethylene oxide) or poly(vinylidene fluoride) derivatives. Examples of low molecular gelling agents include, but are not limited to, dicarboxylic acid, tetra(bromomethyl)benzene, 1-(4-(cyclohexanecarboxamido) phenyl) urea derivatives or benzyl 1-carbamoyl-2-methylbutyl-carbamate derivatives.

The dye-sensitized solar cell of an exemplary embodiment of the invention contains a gel electrolyte composition that is free from or substantially free from one or more of a polymer or a low molecular gelling agent. Further, the problems of evaporation and loss of the electrolyte may be prevented, the lifetime of the cell may be prolonged, difficulties in the packaging process may be reduced and the stability of the cell may be enhanced.

According to the preparation method of a gel electrolyte composition, a gel electrolyte composition may be obtained without extra addition of any or substantially any of one or more of a polymer or a low molecular gelling agent. Hence, the method is simple and economical.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
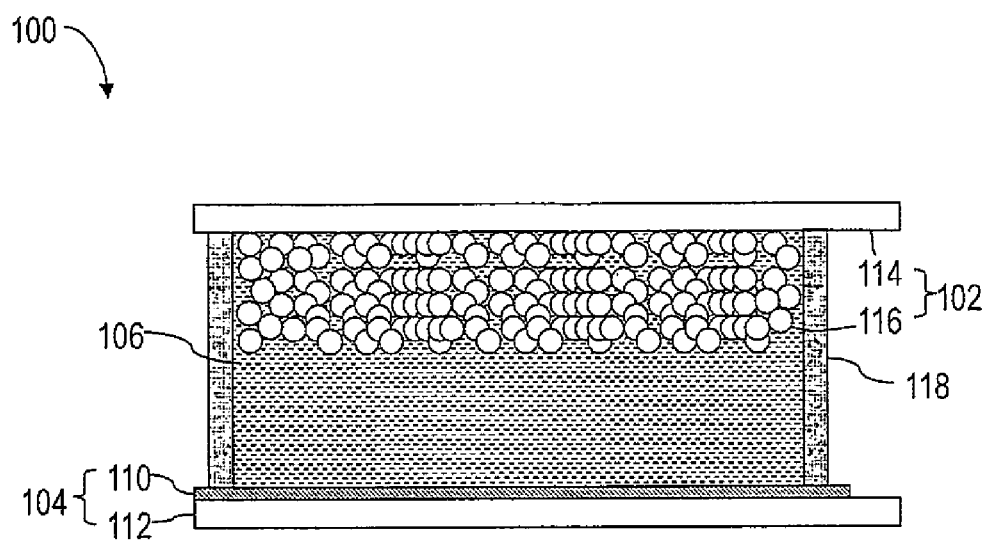
FIG. 1 is a schematic, cross-section illustration of an exemplary dye-sensitized solar cell (DSSC).

The gel electrolyte composition of an exemplary embodiment of the invention refers to an electrolyte composition that is free from or substantially free from one or more of a polymer and a low molecular gelling agent, and the electrolyte composition is a gel-type solution. The composition of a gel electrolyte composition includes a substituted or unsubstituted pyridine, a metal salt (MY), a halogen molecule (e.g., molecular iodine), a substituted or unsubstituted nicotinic acid and a solvent. The composition may be a composition prepared by mixing a substituted or unsubstituted pyridine, a metal salt (MY), a halogen molecule (e.g., molecular iodine), a substituted or unsubstituted nicotinic acid, and a solvent. In one aspect of the invention, the content of the substituted or unsubstituted pyridine is about 0.3 M to 1.2 M (molar concentration, mole/liter); yet in another aspect of the invention, the content is about 0.5 M to 1.0 M. In one aspect of the invention, the content of the metal salt (MY) is about 0.05 M to 0.2 M; yet in another aspect of the invention, the content is about 0.05 M to 0.15 M. In one aspect of the invention, the content of the substituted or unsubstituted nicotinic acid is about 0.3 M to 1.0 M; in another aspect of the invention, the content is about 0.7 M. In one aspect of the invention, the content of the halogen molecule is about 0.03 M to 1.0 M, and is adjustable according the required conductivity. The content of the solvent depends on the molar concentration of the overall formulation.

The structure of the substituted or unsubstituted pyridine may be represented by the following formula (1):

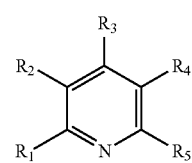

Formula (1)

wherein $R_1$ to $R_5$ are same or different substituents that independently represent hydrogen, alkyl, hydroxymethyl, vinyl or hydroxyl. The substituted or unsubstituted pyridine and the substituted or unsubstituted nicotinic acid may form a π-π stack, serving as a surfactant.

The "M" in the metal salt (MY) is an alkali group (IA) metal cation, and "Y" is a halogen anion, such as iodide ion or bromide ion. The metal salt (MY) includes, for example, LiI, NaI, KI, LiBr, NaBr, or KBr. The halogen molecule may include molecular iodine ($I_2$) or molecular bromine ($Br_2$). In one aspect of the invention, the metal salt (MY) may be a metal iodide salt, such as LiI. The halogen molecule may be molecular iodine ($I_2$), wherein molecular iodine ($I_2$) and the iodide ion in the metal salt (MY) may react to form triiodide ion ($I_3^-$). The triiodide ion and the iodide ion may constitute the oxidation/reduction ion pair in the electrolyte. In another aspect of the invention, the metal salt (MY) may be a metal bromide salt, such as KBr, wherein the halogen molecule is molecular iodine ($I_2$) or bromine ($Br_2$). The metal ions may carry the role of gelling the electrolyte, while molecular iodine and nicotinic acid may constitute the oxidation/reduction pair in the electrolyte.

The substituted and unsubstituted nicotinic acid may be represented by one of the following formula (2):

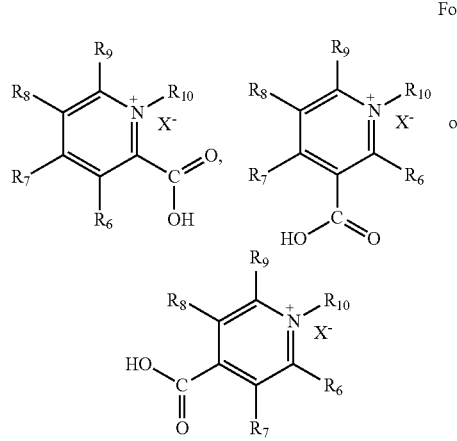

Formula (2)

wherein $R_6$ to $R_9$ may be the same or different and are independently hydrogen, alkyl, hydroxyl, amino, trifluoromethyl or halogen, etc. $R_{10}$ is a $C_nH_{2n+1}$ alkyl, wherein n is 1 to 12. X is an iodide ion, a bromide ion, $ClO_4^-$, $CF_3SO_3^-$, $SCN^-$, $PF_6^-$ or $BF_4^-$. X may be the same or different from the halogen ion "Y" in the metal salt (MY).

The solvent in the gel electrolyte composition may be a hydrogen bond acceptor (HBA) or a hydrogen bond donor (HBD). Illustrative, but non-limiting HBAs include a chemical compound containing a cyano group, for example, acetonitrile (AN), 3-methoxypropiontrile, or valeronitrile (VN). Illustrative, but non-limiting HBDs include 1,4-dichlorobutane, 1,5-dichloropentane, 1,6-dichlorohexane or 1,4-dichloroheptane.

Further, the composition of the gel electrolyte may include guanidinium thiocyanate (GuSCN) for increasing the photovoltage. Alternatively, the gel electrolyte composition may include other ingredients, such as molten salts that may increase ionic conductivity, metal salts that may change the conduction band potential or an enhancer that may increase charge transmissions. Examples of molten salts, metal salts and enhancers include, but are not limited to, imidazolium, pyridinium, or pyrrolidinium cations-based ionic liquid.

Different methods may be applied to fabricate the above gel electrolyte composition. In one exemplary embodiment, the preparation of the above gel electrolyte composition includes dissolving respectively and mixing the substituted or unsubstituted nicotinic acid and halogen molecule in the above-mentioned solvent at a temperature such as room temperature to form a solution. Then, the above-mentioned metal salt MY is added to the solution. Thereafter, the substituted or unsubstituted pyridine is added, followed by mixing (e.g., vigorous mixing) to gel the solution and form a gel electrolyte composition. The mixing rate may be about 2000 to 3000 rpm. The period of mixing may be about, for example, 0.5 to 1 minute. It is to be understood that the mixing rate and period of mixing depend on the actual requirements and conditions. The gel electrolyte composition is one exemplary embodiment is preferably free from or substantially free from any polymer or low molecular gelling agent.

The fabrication method of a gel electrolyte composition may be represented by the following scheme:

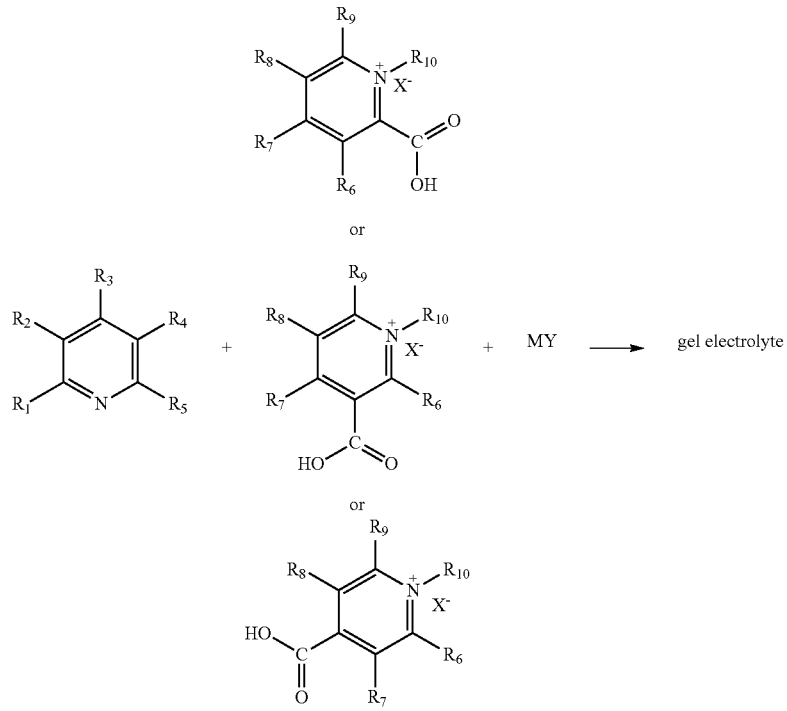

In order to increase the photovoltage, guanidinium thiocyanate (GuSCN) may be added to the solution, for instance, prior to the addition of the substituted or unsubstituted pyridine. Further, prior to the addition of the above-mentioned metal salt MY, additive ingredients, such as molten salts that may increase ionic conductivity, metal salts that may change the conductive band voltage or an enhancer that may increase charge transmissions may be added. The addition of these ingredients does not affect the gel characteristics of the gel electrolyte.

The addition of one or more of a polymer gel and a low molecular gelling agent may optionally be omitted from the fabrication of a gel electrolyte composition of this exemplary embodiment of the invention. Further, it is preferred to vigorously mix the substituted or unsubstituted nicotinic acid, the metal salt MY, the halogen molecule and the substituted or unsubstituted pyridine in the above-mentioned solvent at room temperature, so as to gel the solution to form a gel electrolyte composition. The resulting gel electrolyte composition thereby serves as an electron transmission net of the oxidation/reduction ion pair.

The above gel electrolyte composition of the invention may be applicable in various types of cells, for example, dye-sensitized solar cells or ultra capacitors or lithium batteries. Although the following discussion is exemplified with a dye-sensitized solar cell, it should be appreciated that the invention is not limited to one particular form of cell, and is applicable to other forms of cell without departing from the invention.

FIG. 1 is a schematic, cross-section illustration of a dye-sensitized solar cell (DSSC) according to one exemplary embodiment of the invention.

Referring to FIG. 1, the dye-sensitized solar cell 100 of this exemplary embodiment includes a working electrode 102, a counter electrode 104 and a gel electrolyte 106. The counter electrode 104 is disposed corresponding to the working electrode 102, while the gel electrolyte composition 106 is disposed between the working electrode 102 and the counter electrode 104.

In this exemplary embodiment, the counter electrode 104 is, for example, a transparent conductive substrate 112 plated with a platinum layer 110. The working electrode 102 is, for example, a transparent conductive substrate 114 with a metal oxide thin film 116 formed on the surface of the transparent conductive substrate 114, wherein the metal oxide thin film 116 may include a dye. The above-mentioned dye may include a metal complex including a metal such as ruthenium, osmium, iron, illinium, platinum or zinc, may include a metal-free organic compound. The material of the above-mentioned metal oxide thin film 116 includes, but is not limited to, titanium dioxide ($TiO_2$), ZnO, $Al_2O_3$, $SiO_2$ or $Ti_xAl_yO_z$ (x=1-3, y=1-3, z=1-6). The transparent conductive substrates 112 and 114 are constructed with, for example, a transparent conductive glass, a plastic base material or a metal base material. A spacer 118 may be configured between the counter electrode 104 and the working electrode 102 for sealing the gel electrolyte composition 106.

The composition of the gel electrolyte 106 is as discussed above, and will not be further reiterated herein. Further, the composition of the gel electrolyte 106 may include guanidinium thiocyanate (GuSCN) that may increase the photovoltage. The content of guanidinium thiocyanate may be about 0.05 M to about 0.2 M. The concentration guanidinium thiocyanate being added may be adjusted according to the device efficiency. Moreover, the composition of the gel electrolyte 106 may include molten salts that may increase ionic conductivity, metal salts that may change the conduction band potential or an enhancer that may increase charge transmissions.

In the above description, reference is made to various exemplary embodiments of the structural components and the configuration of the structural components in a dye-sensitized solar cell in which the invention may be practiced. It is to be understood that embodiments of other types of dye-sensitized solar cells in which the gel electrolyte composition of the invention is applicable may be employed without departing from the invention.

EXAMPLE 1

Preparation of Dye Solution

An alcohol and a (cis-bis(isothiocyanato)bis(2,2'-bipyridyl-4,4'-dicarboxylato)-ruthenium(II) (N-719 dye (Ruthenium 535) manufactured by Solaronix Company) are used to form an alcohol solution of a (cis-bis(isothiocyanato)bis(2,2'-bipyridyl-4,4'-dicarboxylato)-ruthenium(II) dye with a concentration of $3 \times 10^{-4}$ M.

Fabrication of Working Electrode

A nitrogen gas gun is used to purge the base plate surface. A fluorine tin oxide (FTO) conductive glass base plate is placed in a beaker containing acetone and ultrasonically cleaned for 20 minutes using an ultrasonic cleaner to remove residual fragments and various contaminants thereon. The base plate is then placed in a beaker containing isopropyl alcohol (IPS), followed by ultrasonic cleaning for 20 minutes with an ultrasonic cleaner to remove the acetone or other possible oil residues. Then, the base plate is placed in a beaker containing de-ionized water, followed by an ultrasonic cleaning for 20 minutes using an ultrasonic cleaner. The base plate is then blow-dried with a nitrogen gas gun. The base plate is further placed and dried in an oven at 110° C. for about 10 minutes to remove the excess moisture. A titania paste (manufactured by Solaronix Company) is then placed on the cleaned FTO conductive glass base plate and is scraped with a knife to a uniform film thereof. After being dried in the shade, the conductive glass base plate with the thin film of titania paste is sintered in an oven at about 450° C. An electrode thin film with a thickness of about 8 micron (um) is thereby formed to complete the fabrication of a working electrode.

Dye Adsorption

The working electrode is placed on a hot plate and is heated to 80° C. After moisture is removed, the process of dye (Solaronix N719) adsorption is performed. The duration of the dye adsorption process is about 24 hours. During the adsorption process, the dye is prevented from being irradiated by light to circumvent the decomposition of the dye molecules due to a catalytic effect, which would then decrease the efficiency.

Fabrication of Counter Electrode

The cleaned ITO glass base plate is placed on a holder of a DC sputtering machine, wherein the power is adjusted to 175 watts, the flow rate of argon gas is maintained at about 10 sccm and the sputtering pressure is set at about 1 mtorr. The sputtering process is conducted for about 10 seconds to form a platinum counter electrode of a thickness of about 30 nanometer (nm).

Preparation of Electrolyte:

The electrolyte is the medium for charge transmission and mainly relies on the oxidation/reduction pair, such as triiodide ion/iodide ion ($I_3^-/I^-$) for transmitting electrons. The solvent used is acetonitrile (AN). 0.5 M of 4-tert-butylpyridine (TBP) is used as a surfactant. The source of ($I_3^-/I^-$) is 0.6 M of 1-butyl-3-carboxylpyridinium iodide and 0.03M of molecular iodine ($I_2$). Then, 0.1 M of guanidinium thiocyanate (GuSCN($C_2H_6N_4S$ or $CH_5N_3 \cdot HSCN$) is added to increase the photovoltage. Subsequently, 0.1 M of LiI is added. After gelling, an electrolyte formulation is obtained. The adding sequence of the above components does not affect the gelling process and may be modified according to the actual requirements and conditions.

Packaging of Cell

The dye-sensitized solar cell is a sandwiched structure, wherein the sequence of the layers in the structure is: TCO/Sensitized $TiO_2$/gel electrolyte composition/Pt/TCO. Further, the Surlyn® ethylene copolymer manufactured by DuPont or the Solaronix® SX1170-60 ethylene copolymer (a 60 microns thick thermoplast hot-melt sealing foil) series, may be used as a spacer or an encapsulant to separate the $TiO_2$ working electrode and the counter electrode, and to provide a channel to-be-filled by the electrolyte composition. A thermal adhesive film is then employed to provide adhesion between the two electrodes to complete the preliminary packaging of the cell.

Efficiency Measurement

The photoelectric conversion efficiency detection system includes a solar simulator and a Keithley 2400 multi-function digital power meter. The power of the solar simulator is calibrated to 100 $mW/cm^2$. The packaged cell is then placed under the light source of the solar simulator to perform an efficiency measurement. During the measurement, the scan voltage of the Keithley 2400 is set at −0.1 to 1V with a delay time of 100 milliseconds (ms), and the current generated by the DSSC is recorded to obtain a current vs. voltage (I-V) characteristic curve. From the I-V curve, the open circuit voltage $V_{oc}$, the short circuit current $I_{sc}$, the maximum output voltage ($V_m$, $V_{max}$), the maximum output current ($I_m$, $I_{max}$) are obtained. From equation 1, the filling factor (FF) can be calculated. After dividing the FF with the area of the electrode, a current density vs. voltage curve (J-V curve) is obtained. By using another, equation 2, the photoelectric conversion efficiency ($\eta$) is calculated, wherein $P_{in}$ is the incident light power density.

$$FF = \frac{V_m \times I_m}{V_{oc} \times I_{sc}} \quad \text{(Equation 1)}$$

$$\eta = \left(\frac{V_{oc} \times I_{sc}}{P_{in}}\right) \times FF \quad \text{(Equation 2)}$$

Experimental Results

The open circuit voltage $V_{oc}$, the short circuit current density $J_{sc}$, the filling factor and the photoelectric conversion efficiency ($\eta$) of the dye-sensitized solar cells are summarized in Table 1.

TABLE 1

| Example | 1 | 2 | 3 | 4 | 5 | 6 | 7 | 8 | Comparative |
|---|---|---|---|---|---|---|---|---|---|
| open circuit voltage ($V_{oc}$) | 0.59 | 0.54 | 0.56 | 0.56 | 0.06 | 0.18 | 0.54 | 0.58 | 0.80 |
| short circuit current density ($J_{sc}$, mA/cm$^2$) | 9.39 | 4.81 | 8.68 | 8.18 | 6.83 | 7.18 | 7.79 | 6.70 | 6.77 |
| Filling Factor (FF) | 0.67 | 0.49 | 0.48 | 0.43 | 0.20 | 0.26 | 0.66 | 0.69 | 0.74 |
| Photoelectric conversion efficiency ($\eta$) | 3.69 | 1.29 | 2.33 | 1.96 | 0.09 | 0.33 | 2.77 | 2.66 | 3.96 |

Figure 2:
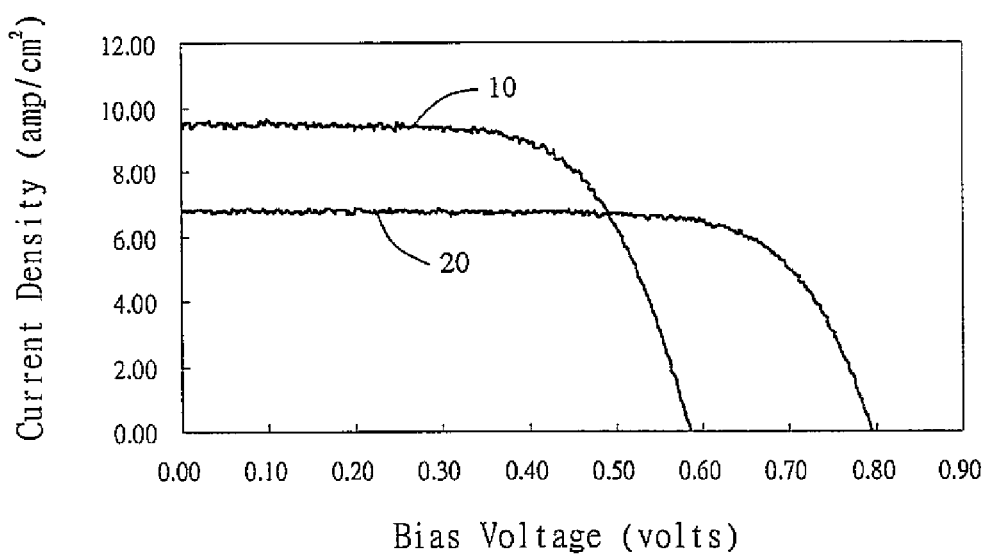
FIG. 2 is a diagram illustrating the relationships between the current density and the bias voltage of Example 1 and Comparative Example 1.

The characteristic curves 10 and 20 of current density vs. bias voltage of the dye-sensitized solar cell of Example 1 and the Comparative Example, respectively, are shown in FIG. 2.

The above results suggest that due to the application of a gel electrolyte composition in a DSSC of an embodiment of the invention, under a minimal effect on the conductivity, the diffusion rate and the conversion efficiency, the evaporation and loss of the electrolyte during the packaging process and the operation of the cell are mitigated. Hence, difficulties in the packaging process are reduced, and the stability and efficiency of the cell are enhanced to prolong the lifetime of the cell. Additionally, the cost is reduced and the performance is improved.

EXAMPLE 2

This example is similar to Example 1, the only differences are that in the electrolyte formulation, the 0.6 M of 1-butyl-3-carboxylpyridinium iodide is replaced with 0.6 M of 1-ethyl-3-carboxylpyridinium iodide and the acetonitrile is replaced with 3-methoxypropionitrile.

EXAMPLE 3

This example is similar to Example 1, the only differences are that in the electrolyte formulation, the 0.6 M of 1-butyl-3-carboxylpyridinium iodide is replaced with 0.6 M of 1-hexyl-3-carboxylpyridinium iodide and the acetonitrile is replaced with 3-methoxypropionitrile.

EXAMPLE 4

This example is similar to Example 1, the only differences are that in the electrolyte formulation, the 0.6 M of 1-butyl-3-carboxylpyridinium iodide is replaced with 0.6 M of 1-octyl-3-carboxylpyridinium iodide and the acetonitrile is replaced with 3-methoxypropionitrile.

EXAMPLE 5

This example is similar to Example 4, the only differences are that in the electrolyte formulation, the 0.1 M of LiI is replaced with 0.1 M of KI and the 3-methoxypropionitrile is replaced with acetonitrile.

EXAMPLE 6

This example is similar to Example 3, the only differences are that in the electrolyte formulation, the 0.1 M of LiI is replaced with 0.1 M of KBr and the 3-methoxypropionitrile is replaced with acetonitrile.

EXAMPLE 7

This example is similar to Example 3, the only differences are that in the electrolyte formulation, the 0.5 M of 4-tert-butylpyridine (TBP) is replaced with 0.5M of pyridine and the 3-methoxypropionitrile is replaced with acetonitrile.

EXAMPLE 8

This example is similar to Example 3, the only differences are that in the electrolyte formulation, the 0.5 M of 4-tert-butylpyridine (TBP) is replaced with 0.5M of ((pyridine-3-yl)methanol) and the 3-methoxypropionitrile is replaced with acetonitrile.

EXAMPLE 9

This example is similar to Example 3, the only differences are that in the electrolyte formulation, the 0.5 M of 4-tert-butylpyridine (TBP) is replaced by 0.5M of 4-vinylpyridine and the 3-methoxypropionitrile is replaced with acetonitrile.

EXAMPLE 10

This example is similar to Example 1, the only differences are that in the electrolyte formulation, the 0.6 M of 1-butyl-3-carboxylpyridinium iodide is replaced with 0.6 M of 1-butyl-4-carboxylpyridinium iodide.

Comparative Example

This example is similar to Example 1, the only difference is that the electrolyte formulation is replaced by a Solaronix Iodolyte AN-50 standard electrolyte formulation.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A gel electrolyte composition, comprising:
   (a) a substituted or unsubstituted pyridine of Formula (1):

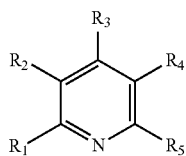

Formula (1)

wherein $R_1$ to $R_5$ are the same or different, and independently represent hydrogen, alkyl, hydroxymethyl, vinyl or hydroxyl;
   (b) a metal salt of the following formula: MY, wherein M is an alkali group (IA) metal cation, and Y is a halogen anion;
   (c) a halogen molecule;
   (d) a substituted or unsubstituted nicotinic acid, represented by one of the following Formula (2):

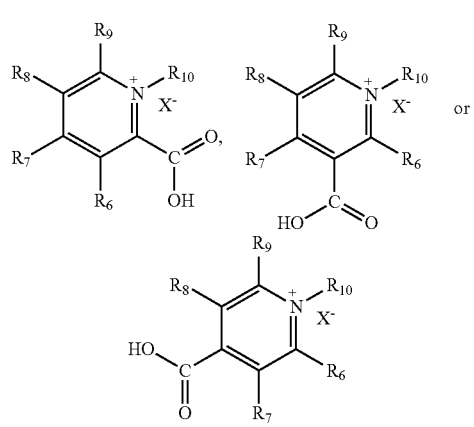

Formula (2)

wherein $R_6$ to $R_9$ are the same or different, and independently represent hydrogen, alkyl, hydroxyl, amino, trifluoromethyl or halogen, $R_{10}$ is a $C_nH_{2n+1}$ alkyl, wherein n is 1 to 12, X is an iodide ion, a bromide ion, $ClO_4^-$, $CF_3SO_3^-$, $SCN^-$, $PF_6^-$ or $BF_4^-$; and
   (e) a solvent,
   wherein said composition is optionally free from or substantially free from one or more of a polymer and a low molecular gelling agent.

2. The gel electrolyte composition of claim 1, wherein a content of the substituted or unsubstituted pyridine is about 0.3 M to 1.2 M (mole/liter), a content of the metal salt MY is about 0.05 M to 0.2 M (mole/liter), a content of the halogen molecule is about 0.03 M to 1.0 M (mole/liter), and a content of the substituted or unsubstituted nicotinic acid is about 0.3 M to 1.0 M (mole/liter).

3. The gel electrolyte composition of claim 1, wherein (1) the metal salt MY is a metal iodide salt and the halogen molecule is molecular iodine, or (2) the metal salt is a bromide salt and the halogen molecule is molecular iodine.

4. The gel electrolyte composition of claim 1, further comprising guanidinium thiocyanate (GuSCN).

5. The gel electrolyte composition of claim 1, wherein said composition is substantially free from a polymer and a low molecular gelling agent.

6. A dye-sensitized solar cell, comprising:
   a working electrode;
   a counter electrode, disposed corresponding to the working electrode; and
   the gel electrolyte composition of claim 1, disposed between the working electrode and the counter electrode.

7. The dye-sensitized solar cell of claim 6, wherein (1) the metal salt is a metal iodide salt and the halogen molecule is molecular iodine, or (2) the metal salt is a bromide salt and the halogen molecule is molecular iodine.

8. The dye-sensitized solar cell of claim 6, wherein the counter electrode comprises a transparent conductive substrate plated with platinum.

9. The dye-sensitized solar cell of claim 6, wherein the working electrode comprises:
   a transparent conductive substrate; and
   a metal oxide thin film formed on a surface of the transparent conductive substrate, wherein the metal oxide thin film comprises a dye.

10. The dye-sensitized solar cell of claim 9, wherein the dye comprises a metal complex comprising a metal selected from the group consisting of ruthenium, osmium, iron, illinium, platinum and zinc.

11. The dye-sensitized solar cell of claim 9, wherein the dye comprises a non-metal organic compound.

12. The dye-sensitized solar cell of claim 9, wherein the metal oxide thin film comprises $TiO_2$, $ZnO$, $Al_2O_3$, $SiO_2$ or $Ti_xAl_yO_z$, wherein x=1-3, y=1-3, and z=1-6.

13. The dye-sensitized solar cell of claim 9, wherein the transparent conductive substrate comprises glass, plastic or metal.

14. The dye-sensitized solar cell of claim 6, wherein said composition is free from or substantially free from a polymer and a low molecular gelling agent.

15. A method for preparing a gel electrolyte composition comprising:
   (a) a substituted or unsubstituted pyridine of Formula (1):

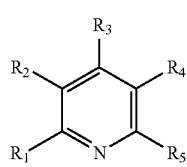

Formula (1)

wherein $R_1$ to $R_5$ are the same or different, and independently represent hydrogen, alkyl, hydroxymethyl, vinyl or hydroxyl;
   (b) a metal salt of the following formula: MY, wherein M is an alkali group (IA) metal cation, and Y is a halogen anion;
   (c) a halogen molecule;

(d) a substituted or unsubstituted nicotinic acid, represented by one of the following Formula (2):

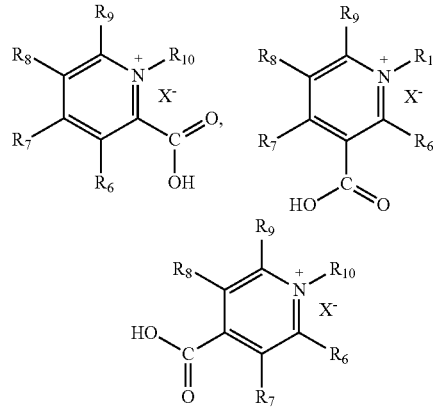

Formula (2)

wherein $R_6$ to $R_9$ are the same or different, and independently represent hydrogen, alkyl, hydroxyl, amino, trifluoromethyl or halogen, $R_{10}$ is a $C_nH_{2n+1}$ alkyl, wherein n is 1 to 12, X is an iodide ion, a bromide ion, $ClO_4^-$, $CF_3SO_3^-$, $SCN^-$, $PF_6^-$ or $BF_4^-$; and (e) a solvent, wherein said composition is optionally free from or substantially free from one or more of a polymer and a low molecular gelling agent, the method comprising:

dissolving the substituted or unsubstituted nicotinic acid and the halogen molecule in the solvent to form a first solution;

adding the metal salt MY into the first solution;

adding the substituted or unsubstituted pyridine into the first solution to form a second solution; and stirring the second solution to gel the second solution and form the gel electrolyte composition.

16. The method of claim 15, wherein (1) the metal salt MY is a metal iodide salt and the halogen molecule is molecular iodine, or (2) the metal salt is a metal bromide salt and the halogen molecule is molecular iodine.

17. The method of claim 15, wherein said composition is free from or substantially free from a polymer and a low molecular gelling agent.

18. A gel electrolyte composition prepared by mixing the following ingredients:

(a) a substituted or unsubstituted pyridine of Formula (1):

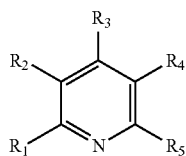

Formula (1)

wherein $R_1$ to $R_5$ are the same or different, and independently represent hydrogen, alkyl, hydroxymethyl, vinyl or hydroxyl;

(b) a metal salt of the following formula: MY, wherein M is an alkali group (IA) metal cation, and Y is a halogen anion;

(c) a halogen molecule;

(d) a substituted or unsubstituted nicotinic acid, represented by one of the following Formula (2):

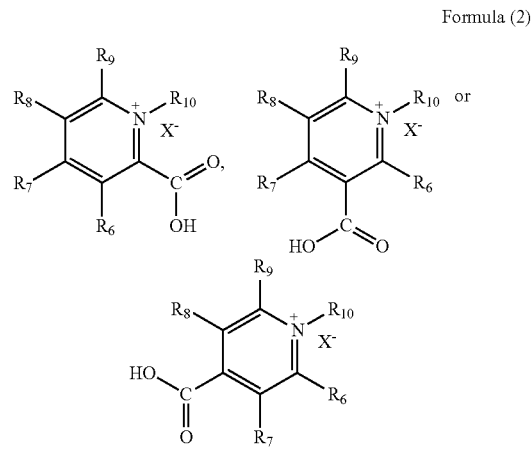

Formula (2)

wherein $R_6$ to $R_9$ are the same or different, and independently represent hydrogen, alkyl, hydroxyl, amino, trifluoromethyl or halogen, $R_{10}$ is a $C_nH_{2n+1}$ alkyl, wherein n is 1 to 12, X is an iodide ion, a bromide ion, $ClO_4^-$, $CF_3SO_3^-$, $SCN^-$, $PF_6^-$ or $BF_4^-$; and (e) a solvent, wherein said composition is optionally free from or substantially free from one or more of a polymer and a low molecular gelling agent.

19. The gel electrolyte composition of claim 18, wherein said composition is substantially free from a polymer and a low molecular gelling agent.

* * * * *